United States Patent [19]
Chu

[11] Patent Number: 6,130,125
[45] Date of Patent: Oct. 10, 2000

[54] METHOD OF FABRICATING CAPACITOR WITH A RING TRENCH

[75] Inventor: Hsin-Kun Chu, Hsinchu Hsien, Taiwan

[73] Assignee: United Integrated Circuits Corp., Hsinchu, Taiwan

[21] Appl. No.: 09/270,024

[22] Filed: Mar. 16, 1999

[30] Foreign Application Priority Data

Jan. 28, 1999 [TW] Taiwan ................................. 88101284

[51] Int. Cl.[7] .............................................. H01L 21/8242
[52] U.S. Cl. ............................................ 438/253; 438/634
[58] Field of Search ..................................... 438/253, 254, 438/396, 397, 634

[56] References Cited

U.S. PATENT DOCUMENTS

| | | | |
|---|---|---|---|
| 5,759,888 | 6/1998 | Wang et al. | 438/253 |
| 5,909,620 | 6/1999 | Wu | 438/253 |
| 6,025,246 | 2/2000 | Kim | 438/253 |
| 6,027,981 | 6/1998 | Wu | 438/253 |

*Primary Examiner*—Chandra Chaudhari
*Attorney, Agent, or Firm*—J. C. Patents; Jiawei Huang

[57] ABSTRACT

A method of fabricating a capacitor is described. A dielectric layer is formed on a substrate. A node contact opening is formed in the dielectric layer to expose a portion of the substrate. A conductive layer is formed on the dielectric layer to cover the node contact opening. A ring trench is formed in the conductive layer above the node contact opening. An oxide layer is formed to fill the ring trench. An etching stop layer is formed to cover the oxide layer, the conductive layer encircled by the oxide layer, and a portion of the oxide layer beside the oxide layer. The etching stop layer defines a capacitor area. The conductive layer exposed by the etching stop layer is removed until the dielectric layer is exposed. The oxide layer and the etching stop layer are removed to expose the remaining conductive layer. A capacitor dielectric layer and a top electrode are formed in sequence to cover the remaining conductive layer.

16 Claims, 3 Drawing Sheets

METHOD OF FABRICATING CAPACITOR WITH A RING TRENCH

CROSS-REFERENCE TO RELATED APPLICATION

This application claims the priority benefit of Taiwan application serial no. 88101284, filed Jan. 28, 1999, the full disclosure of which is incorporated herein by reference.

BACKGROUND OF THE INVENTION

1. Field of the Invention

The present invention relates to a semiconductor fabricating method. More particularly, the present invention relates to a method of fabricating a capacitor.

2. Description of the Related Art

Memory function of a Dynamic Random Access Memory (DRAM) is carried out by controlling the voltage applied to the source region of a metal oxide semiconductor (MOS) transistor. Applying the voltage to the MOS transistor motivates electrons of a capacitor to flow. In this manner, a read or a write operation is carried out. However, when the capacitor is operated, the electrons in the capacitor are in a non-equilibrium state. In this non-equilibrium state, current leakage easily occurs. Therefore, it is necessary to refresh the capacitor periodically.

The refresh frequency depends on the charge-storage ability of the capacitor. As the storage ability of the capacitor increase, the refresh frequency for the capacitor is decrease. Thus, increasing the storage ability of the capacitor has become a development trend.

There are several methods for increasing the storage capacity of the capacitor. The methods include improving dielectric material and conductive material, and increasing the surface area of the capacitor. In order to increase the surface area of the capacitor, a hollow, cylindrical electrode has been developed. The surface area of the hollow, cylindrical bottom electrode is increased by forming an opening in a conductive layer to form a bottom electrode. The sidewall of the opening provides additional surface area in the bottom electrode. In this method, in order to increase further the surface area of the bottom electrode of the capacity, a very thick conductive layer is required.

Typically, the conductive layer is formed by deposition, and it takes a long time to deposit a thick conductive layer. Therefore, the fabrication process is slow down. In addition, because the conductive layer is thick, the conductive layer easily forms a hollow, cylindrical bottom electrode with a high, thin wall. The high, thin wall of the hollow, cylindrical bottom electrode cracks and breaks easily. The quality of the capacitor thus is degraded. The product yield is decreased, as well.

Reference is made to FIG. 1, which further explains the above-described, conventional cylindrical bottom electrode of the capacitor in details.

In FIG. 1, a dielectric layer 102 in formed on the substrate 100. A node contact opening 104 is formed in the dielectric layer 102 to expose a portion of the substrate 100. A patterned conductive layer 106 is formed on the dielectric layer 102 to fill the node contact opening 104. An opening 108 is formed in the conductive layer 106 to make the conductive layer 106 hollow and cylindrical in shape. The patterned conductive layer 106 is used as a bottom electrode. There is a correlation between the thickness of the conductive layer 106 and the surface area of the bottom electrode layer. That is, as the thickness of the conductive layer 106 increases, the surface area of the bottom electrode increases. In order to obtain a large surface area of the bottom electrode, it is desirable to form a thick conductive layer 106 having a thickness of about 8000 angstroms. Therefore, it takes a long time to deposit the conductive layer 106. This, in turn, increases the fabrication time for forming a capacitor, so that the yield is decreased.

Additionally, if the conductive layer 106 is very thick, after a opening 108 is formed in the conductive layer, the hollow, the cylindrical conductive layer 106 is easily formed with a high, thick wall. The high, thin sidewall cracks and breaks easily. In this manner, the quality of the capacitor is degraded.

SUMMARY OF THE INVENTION

The invention provides a method of fabricating a capacitor. A dielectric layer is formed on a substrate. A node contact opening is formed in the dielectric layer to expose a portion of the substrate. A conductive layer is formed on the dielectric layer to cover the node contact opening. A ring trench is formed in the conductive layer above the node contact opening. An oxide layer is formed to fill the ring trench. An etching stop layer is formed to cover the oxide layer, the conductive layer encircled by the oxide layer, and a portion of the oxide layer beside the oxide layer. The etching stop layer defines a capacitor area. The conductive layer exposed by the etching stop layer is removed until the dielectric layer is exposed. The oxide layer and the etching stop layer are removed to expose the remaining conductive layer. The remaining conductive layer is used as a bottom electrode. A capacitor dielectric layer and a top electrode are formed in sequence to cover the remaining conductive layer.

The present invention forms the double concentric cylinder bottom electrode, which has an increased surface area. The deposition time necessary to deposit the conductive layer is reduced. The fabrication time thus is further reduced. In addition, the height of the double concentric cylinder bottom electrode is decreased in comparison with the conventional bottom electrode. Thus, the bottom electrode does not crack and break. The quality and the yield of the capacitor are increased.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
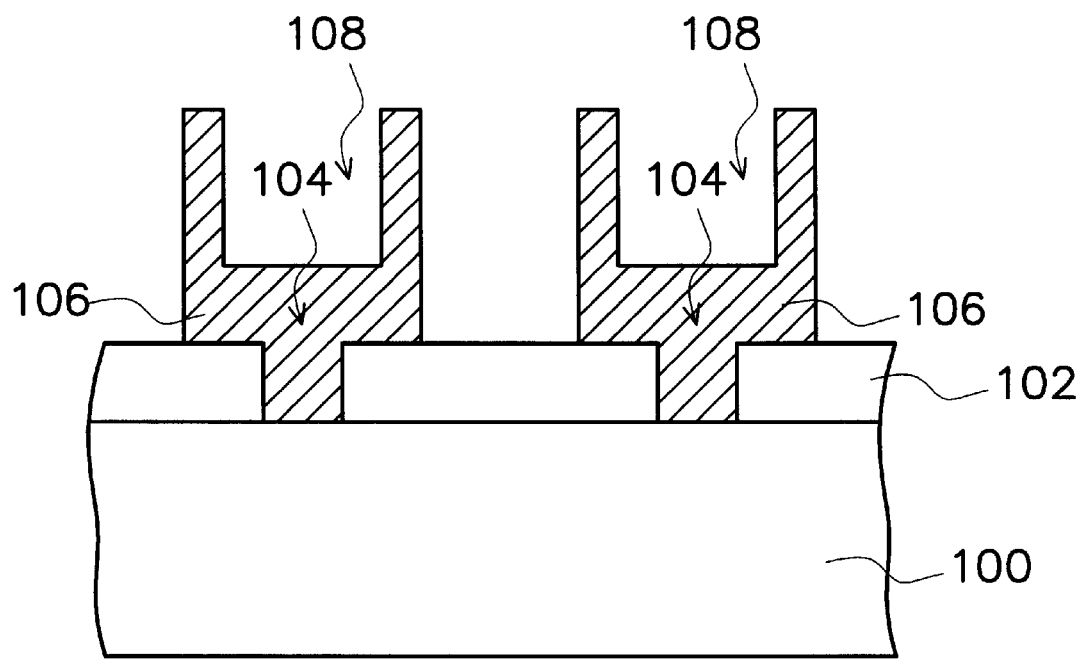
FIG. 1 is a schematic, cross-section view showing a conventional cylindrical bottom electrode of a capacitor.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
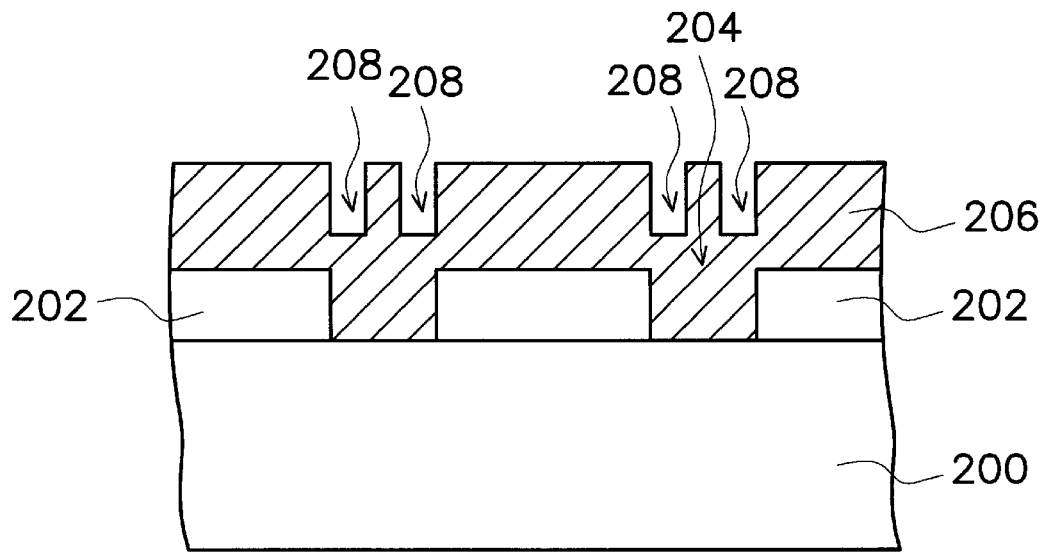
FIGS. 2A through 2D are schematic, cross-sectional views showing a fabricating method of a bottom electrode of a capacitor according to one preferred embodiment of the invention.

In FIG. 2A, a dielectric 202 is formed on the substrate 200. A node contact opening 204 is formed in the dielectric layer 202 to expose a portion of the substrate 200. A conductive layer 206 is formed on the dielectric layer 202 to fill the node contact opening 204 in the conductive layer 206. A ring trench with trench cross sections 208 is formed above the node contact opening 204. The step of forming the ring trench with trench cross sections 208 is, for example, to define the location of the ring trench with trench cross sections 208 first by photolithographic process, and then by partial etching. The depth of ring trench with trench cross sections 208 must be controlled, in order to prevent the dielectric layer 202 from being exposed. The thickness of the conductive layer 206 preferably is about 3500 angstroms and 4500 angstroms. The material of the conductive layer 206 comprises polysilicon.

Figure 2B:
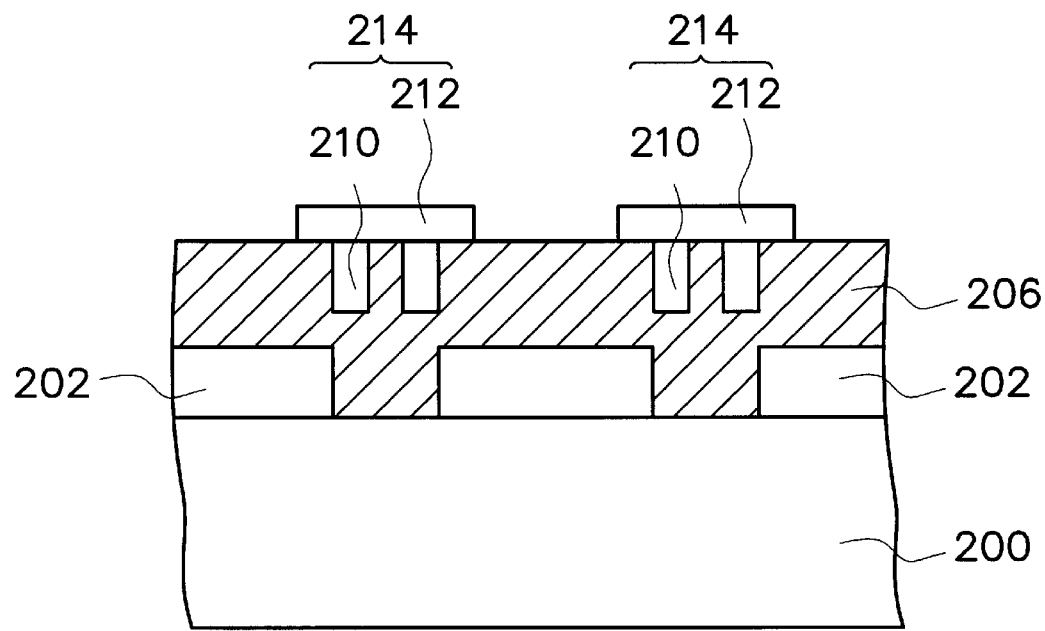

In FIG. 2B, an oxide layer 210 fills the ring trench with trench cross sections 208. An etching stop layer 212 is formed to cover the oxide layer 210, the conductive layer 206 encircled by the oxide layer 210, and a portion of the conductive layer 206 beside the oxide layer 210. The etching stop layer 212 defines a capacitor area 214 which is used to form a capacitor (shown in FIG. 2D) in this area. The material of the etching stop layer 212 comprises oxide or photo-resist material. In case that the material of the etching stop layer 212 is oxide, and the oxide layer 210 and the etching stop layer 212 are formed simultaneously by the following exemplary steps. An oxide material layer (not shown) is formed on the conductive layer 206 to fill the ring trench with trench cross sections 208. A portion of the oxide material layer is removed by a conventional photolithographic and etching process to form simultaneously the oxide layer 210 filling the ring trench 208 and the etching stop layer 212. If the material of the etching stop layer 212 is a photo-resist material, the oxide layer 210 and the etching stop layer 212 are formed separately by the following exemplary steps. The oxide layer 210 filling the ring trench with trench cross sections 208 is formed first. A photo-resist material layer (not shown) is formed on the conductive layer 206 and the oxide layer 210. The photo-resist material layer is patterned to form the etching stop layer 212.

Figure 2C:
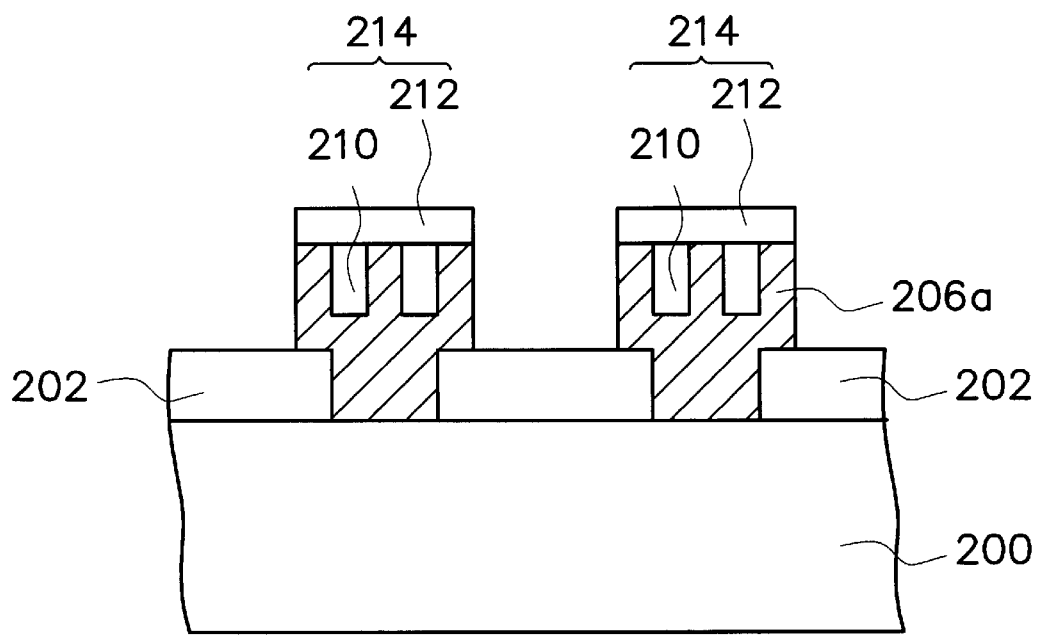

In FIG. 2C, a portion of the conductive layer 206 exposed by the etching stop layer 212 is removed until the dielectric layer 202 is exposed. The conductive layer 206 is removed by, for example, anisotropic etching by plasma. The etching stop layer 212 serves as an etching mask. The plasma is generated from a source gas comprising a $Cl_2$ gas and a HBr gas.

Figure 2D:
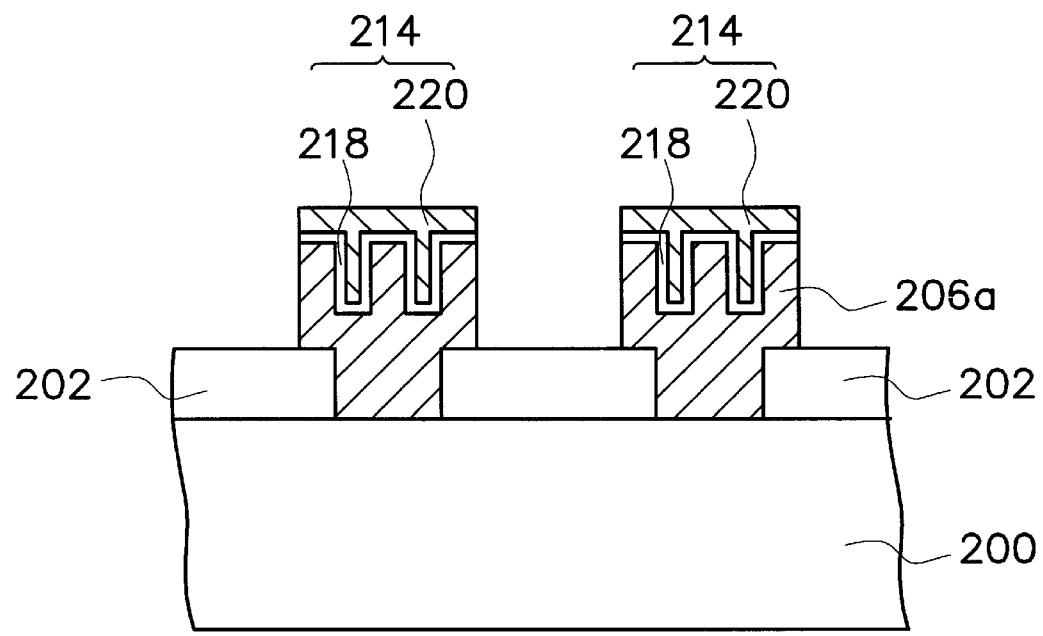

In FIG. 2D, the etching stop layer 212 and the oxide layer 210 are removed to expose a remaining conductive layer 206a in the capacitor area 214. The remaining conductive layer 206a serves as a bottom electrode. A capacitor dielectric layer 218 and a top electrode 220 are formed in sequence over the substrate 200. A capacitor is formed. The capacitor comprises the bottom electrode 206a having a double, concentric cylinder shape.

The present invention forms the double concentric cylinder bottom electrode. In contrast with the conventional method, there is no need to form a thick conductive layer, so as to obtain a sufficient surface area of the bottom electrode. Thus, the fabrication time is decreased. In the invention, the surface area of the capacitor is greatly increased by a double concentric cylinder bottom electrode. The fabrication rate is further enhanced. In addition, in comparison with the conventional method, which forms a bottom electrode with the high, thin wall, there is no high, thin wall formed in the bottom electrode of the present invention. Therefore, the present invention prevents the bottom electrode from cracking and breaking. The fabrication quality is further increased.

It will be apparent to those skilled in the art that various modifications and variations can be made to the structure and the method of the present invention without departing from the scope or spirit of the invention. In view of the foregoing, it is intended that the present invention cover modifications an variations of this invention provided they fall within the scope of the following claims and their equivalents.

What is claimed is:

1. A method of fabricating a capacitor, comprising steps of:

forming a dielectric layer on a substrate;

forming a node contact opening in the dielectric layer to expose a portion of the substrate;

forming a conductive layer on the dielectric layer to cover the node contact opening;

forming a ring trench in the conductive layer above the node contact opening;

forming an oxide layer to fill the ring trench;

forming an etching stop layer to cover the oxide layer, the conductive layer encircled by the oxide layer, and a portion of the oxide layer beside the oxide layer, wherein the etching stop layer defines a capacitor area;

removing the conductive layer exposed by the etching stop layer until the dielectric layer is exposed;

removing the oxide layer and the etching stop layer to expose the remaining conductive layer in the capacitor area, wherein the remaining conductive layer serves as a bottom electrode;

forming a capacitor dielectric layer to cover the bottom electrode; and forming a top electrode to cover the dielectric layer.

2. The method of claim 1, wherein a material of the etching stop layer comprises silicon oxide.

3. The method of claim 1, wherein a material of the etching stop layer comprises photo-resist material.

4. The method of claim 1, wherein the conductive layer has a thickness of about 3500 angstroms to 4500 angstroms.

5. The method of claim 1, wherein the step of forming the ring trench comprises partial etching.

6. The method of claim 1, wherein the step of removing the conductive layer to define the capacitor area comprises anisotropic etching.

7. The method of claim 6, wherein the step of removing the conductive layer comprises anisotropic etching by plasma, wherein the plasma is generated from a source gas comprising a $Cl_2$ gas and a HBr gas.

8. The method of claim 1, wherein a material of the conductive material comprises polysilicon.

9. A method of fabricating a capacitor, comprising steps of:

forming a dielectric layer on a substrate, wherein a node contact opening is formed in the dielectric layer to expose a portion of the substrate;

forming a conductive layer on the dielectric layer to cover the node contact opening;

removing a portion of the conductive layer to form a ring trench directly above the node contact opening;

forming an oxide layer to fill the ring trench;

forming an etching stop layer to cover the oxide layer, the conductive layer encircled by the oxide layer, and a portion of the oxide layer beside the oxide layer, wherein the etching stop layer defines a capacitor area;

removing the conductive layer with the etching stop layer serving as a mask until the dielectric layer is exposed; and removing the oxide layer and the etching stop layer to expose a remaining conductive layer in the capacitor area, wherein the remaining conductive layer serves as a bottom electrode.

10. The method of claim 9, wherein the material of the etching stop layer comprises silicon oxide.

11. The method of claim 9, wherein a material of the etching stop layer comprises a photo-resist material.

12. The method of claim 9, wherein the conductive layer has a thickness of about 3500 angstroms to 4500 angstroms.

13. The method of claim 9, wherein the step of forming the ring trench comprises partial etching.

14. The method of claim 9, wherein the step of removing the conductive layer to define the capacitor area comprises anisotropic etching.

15. The method of claim 14, wherein the step of removing the conductive layer comprises anisotropic etching by plasma, wherein the plasma is generated from a source gas comprising a $Cl_2$ gas and a HBr gas.

16. The method of claim 9, wherein a material of the conductive material comprises polysilicon.

* * * * *